United States Patent
Lin

(10) Patent No.: US 6,735,083 B2
(45) Date of Patent: May 11, 2004

(54) POROUS CPU COOLER

(75) Inventor: Shu-Ju Lin, Taipei (TW)

(73) Assignee: Inventec Corporation, Taipei (TW)

( * ) Notice: Subject to any disclaimer, the term of this patent is extended or adjusted under 35 U.S.C. 154(b) by 21 days.

(21) Appl. No.: 10/212,696

(22) Filed: Aug. 7, 2002

(65) Prior Publication Data

US 2004/0027806 A1 Feb. 12, 2004

(51) Int. Cl.[7] ................................................ H05K 7/20
(52) U.S. Cl. ...................... 361/704; 361/690; 361/695; 165/80.3; 257/712
(58) Field of Search ................................ 361/687, 697, 361/702–710, 712, 690; 174/16.3, 41.3; 165/80.3, 80.4, 185, 907, 122, 903; 257/713, 722–726, 659, 779, 787, 786, 792, 796; 75/247; 427/294, 295, 123, 124, 370, 348.1

(56) References Cited

U.S. PATENT DOCUMENTS 5,727,622 A * 3/1998 Gurevich et al. .......... 165/80.3
5,914,856 A * 6/1999 Morton et al. ............. 361/690
6,018,459 A * 1/2000 Carlson et al. ............ 361/704
6,271,585 B1 * 8/2001 Osada et al. ............... 257/712
6,438,964 B1 * 8/2002 Giblin ........................ 62/3.5

FOREIGN PATENT DOCUMENTS

JP         358025248 A  *  2/1983  .......... H01L/23/36

* cited by examiner

Primary Examiner—Michael Datskovsky
(74) Attorney, Agent, or Firm—Bacon & Thomas, PLLC

(57) ABSTRACT

The invention is to provide a porous CPU cooler, which comprises a heat sink having a plurality of pores formed therein and therearound being in fluid communication with one another, and at least one heat-directing member on the heat sink. In operation, a current of air is either directed into the pores of the heat sink through the heat-directing member prior to leaving the pores on the surface of the heat sink or directed into the pores of the heat sink from the surface of the heat sink prior to leaving the heat-directing member. Either air path can carry heat accumulated inside and on the surface of the heat sink away for achieving the purpose of cooling CPU.

6 Claims, 4 Drawing Sheets

POROUS CPU COOLER

FIELD OF THE INVENTION

The present invention relates to CPU coolers and more particularly to a porous CPU cooler with increased heat dissipation capability.

BACKGROUND OF THE INVENTION

Information technology has known a rapid, spectacular progress leading to increasing developments of various electronic components which are mounted in computers and computer peripherals. Also, they are widely employed in our daily life and almost all trades. Such trend of expansion not only increases speed and efficiency of information communication but also brings a great convenience to our life and work. For coping the needs of vast consumers both designers and manufacturers of computer components and peripherals endeavor to continuously develop compact ones of such computer components and peripherals as inspired by the slim compact design principle. As such, a complete computer system assembled from such compact components and peripherals is also compact with space saving feature.

Now, the computer components and peripherals are more powerful as the ongoing development of information technology. A central processing unit (CPU) for controlling all components of computer and coupled peripherals must operate in a faster duty cycle for cooperating with the components and peripherals. It is also known a large volume of heat can be generated as the CPU executes in a faster speed. Hence, the performance of computer may be adversely affected if the generated heat of CPU cannot be effectively dissipated. To the worse, the computer may operate abnormally if the generated heat continues to accumulate. Conventionally, for dissipating heat of CPU a cooler is mounted on the CPU for absorbing heat generated during operation. Further, the absorbed heat is quickly dissipated from a large number of fins (i.e., for the purpose of increasing heat dissipation area) of the cooler. As an end, the CPU may normally operate in executing processes.

A well known CPU cooler is shown in FIG. 1. The cooler comprises a heat dissipation mechanism 1 including a flat base 10 rested on a CPU 2, a plurality of parallel fins 12 extended upward from the base 10, and a fan 13 for cooling the CPU 2 mounted above the fins 12 by a predetermined distance. In operation, a current of air set up by the fan 13 is directed to grooves each between two adjacent fins 12 for dispelling heat absorbed by the heat dissipation mechanism 1. As an end, the purpose of cooling CPU is achieved.

However, the prior art suffered from several disadvantages. For example, it is understood that the current of air is set up by blades 132 of the fan 13. As such, a portion of heat absorbed by the fins 12 of the heat dissipation mechanism 1 facing the blades 132 can be quickly dissipated by the current of air. However, another portion of heat absorbed by the fins 12 of the heat dissipation mechanism 1 facing a shaft 134 of the fan 13 cannot be quickly dissipated by the current of air since that portion of the fins 12 is blocked by the shaft 134. As a result, only heat generated on a portion (e.g., areas along the sides) of CPU can be effectively dissipated. Hence, the total heat dissipation efficiency of the CPU 2 is low. This in turn may adversely affect the stability of a running computer. As stated above, volumes of heat is generated as the CPU executes in a faster speed. Thus, the prior art technique of directing current of air set up by the fan 13 into the fins 12 can only carry away a small portion of heat absorbed by the fins 12. In other words, most heat is still accumulated within the fins 12 during operation. As such, the high speed CPU 2 may not operate normally due to high heat. To the worse, the computer may not operate normally because the CPU 2 is operating under a high temperature environment. Thus improvement exists.

SUMMARY OF THE INVENTION

A primary object of the present invention is to provide a porous CPU cooler comprising a heat sink including a plurality of pores formed therein and therearound being in fluid communication with one another, and at least one heat-directing member on the heat sink. In operation, a current of air is either directed into the pores of the heat sink through the heat-directing member prior to leaving the pores on the surface of the heat sink or directed into the pores of the heat sink from the surface of the heat sink prior to leaving the heat-directing member. Either air path can carry heat accumulated inside and on the surface of the heat sink away for achieving the purpose of cooling CPU. By utilizing this, it is possible of effectively dissipating heat accumulated in the fins as experienced by the prior art.

The above and other objects, features and advantages of the present invention will become apparent from the following detailed description taken with the accompanying drawings.

DETAILED DESCRIPTION OF THE PREFERRED EMBODIMENTS

Figure 1:
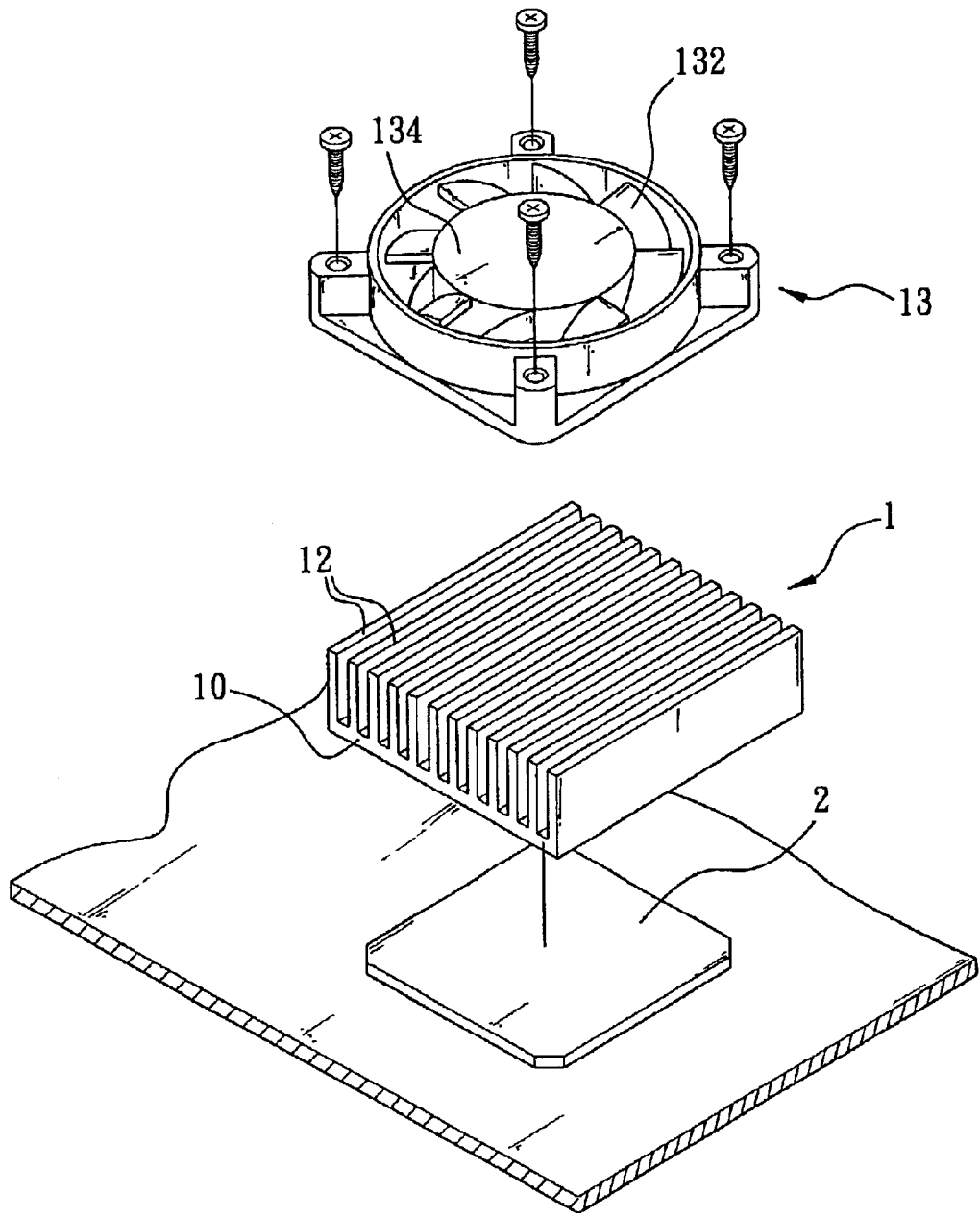
FIG. 1 is an exploded view of a conventional CPU cooler.
Figure 2:
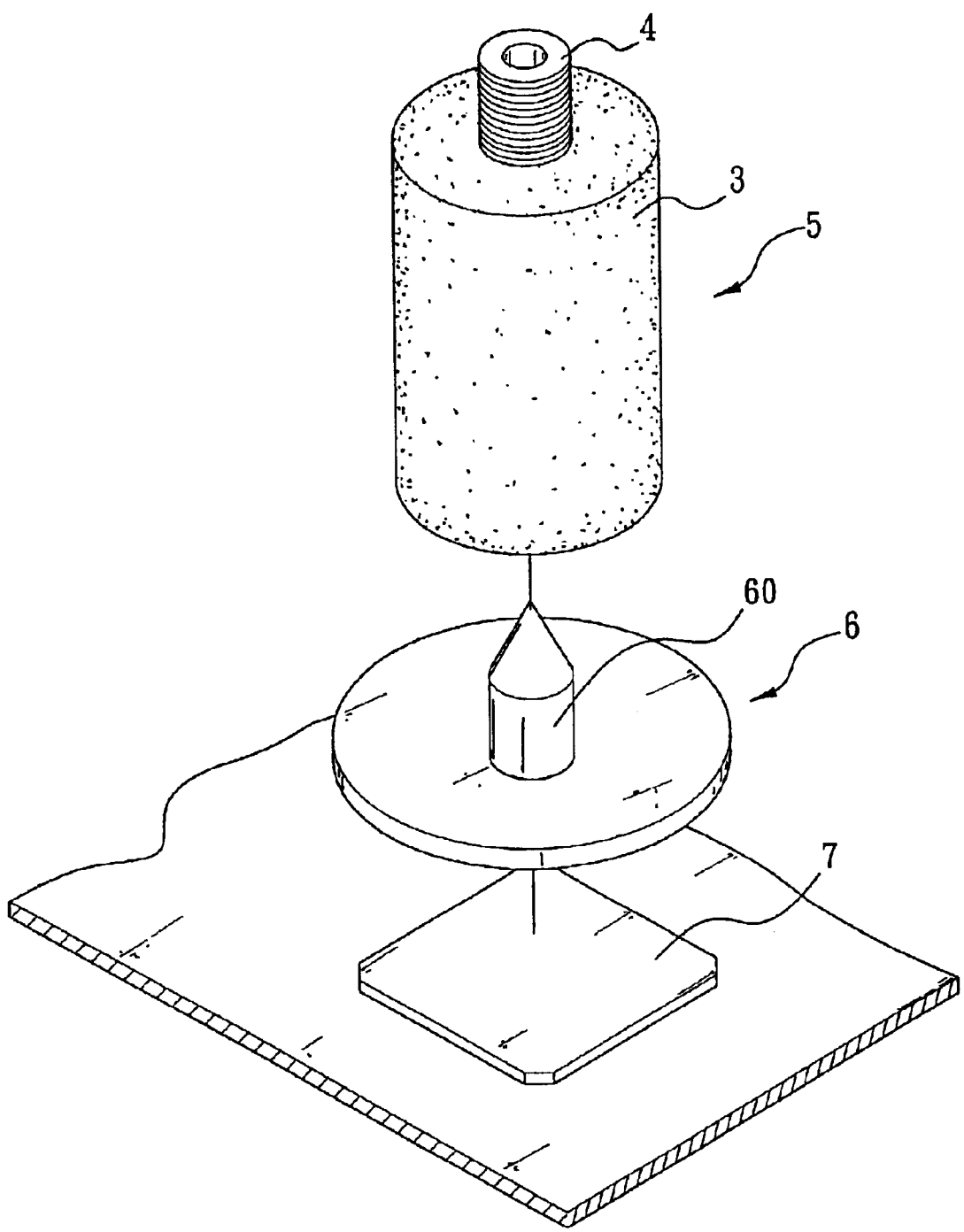
FIG. 2 is an exploded view of a CPU cooler according to the invention.
Figure 3:
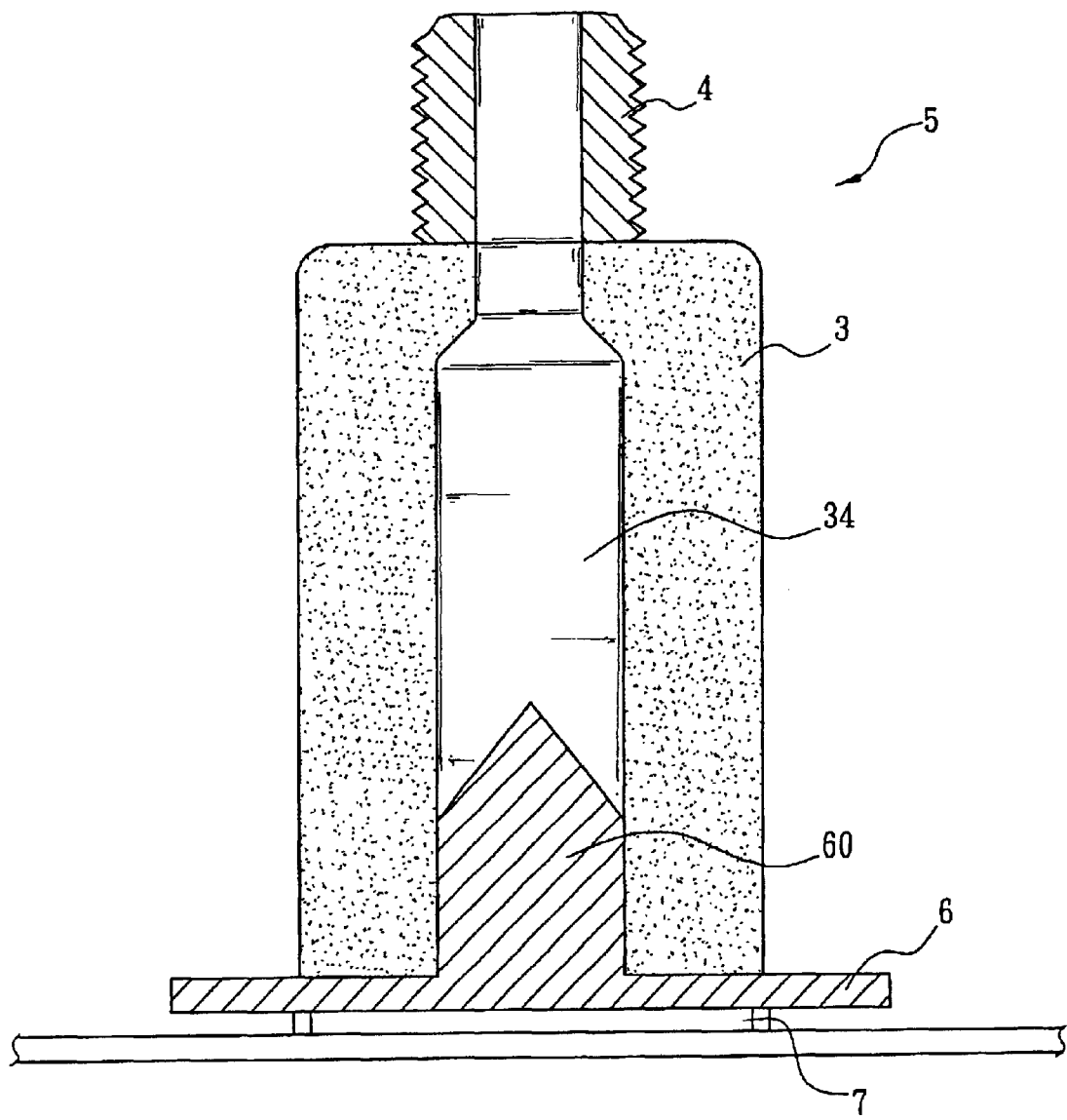
FIG. 3 is a cross-sectional view of the FIG. 2 cooler.
Figure 4:
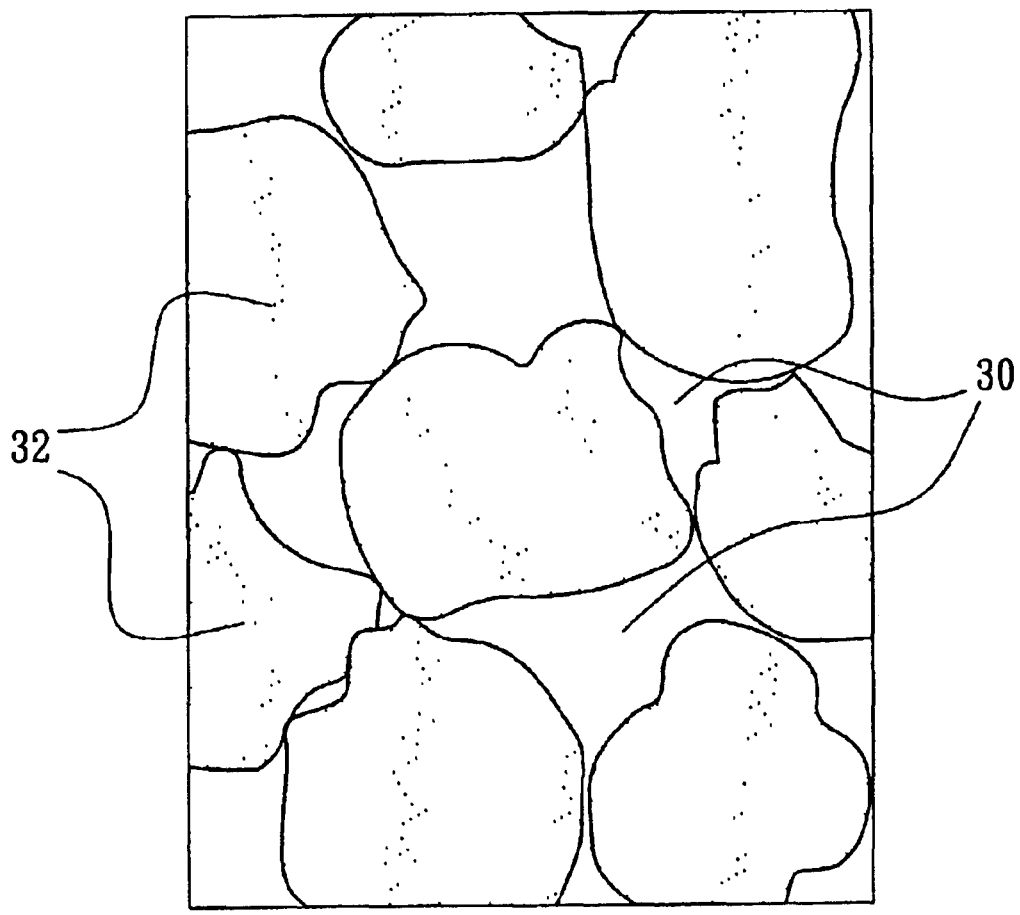
FIG. 4 is a plan view schematically showing heat dissipation particles and pores of a heat sink.

Referring to FIGS. 2, 3, and 4, there is shown a porous CPU cooler in accordance with the invention comprising a cylindrical heat sink 3 including a plurality of pores 30 formed therein and therearound being in fluid communication with one another and at least one cylindrical heat-directing member 4 on the top surface of the heat sink 3. This forms a porous cooler 5. In operation, a current of air is directed into the pores 30 of the heat sink 3 through the heat-directing member 4 prior to leaving the pores 30 on the surface of the heat sink 3. Alternatively, the current of air is directed into the pores 30 of the heat sink 3 from the surface of the heat sink 3 prior to leaving the heat-directing member 4. Either air path can carry heat accumulated inside and on the surface of the heat sink 3 away from the cooler 5. As an end, the purpose of cooling CPU is achieved.

Referring to FIGS. 3 and 4, there is shown a preferred embodiment according to the invention. The heat sink 3 further comprises a plurality of coupled heat dissipation particles 32 mixed with the pores 30 wherein the pores 30 are filled into gaps among the heat dissipation particles 32. As such, heat, absorbed by one heat dissipation particle 32 of the heat sink 3, may quickly transfer to other adjacent heat dissipation particles 32. As a result, the heat sink 3 can quick absorb heat. Hence, heat can be quickly carried away from the heat dissipation particles 32 around the pores 30 by the current of air which is passing through the pores 30. As an end, the accumulated heat in the heat sink 3 is quickly dissipated. In the embodiment, each of the heat dissipation particles 32 is formed of copper. The heat sink 3 is formed by means of powder metallurgy. Preferably, a ratio of volume of the heat dissipation particles 32 and that of the pores 30 is from about 1:0.18 to about 1:0.20 so as to facilitate the current of air to pass through the pores 30 for quickly dissipating heat.

Referring to FIGS. 2, 3 and 4 again, in the embodiment the heat sink 3 comprises a through hole 34 extended from one end to the other. A heat absorption mechanism 6 is mounted at the lower end of the heat sink 3. The heat-directing member 4 is mounted on the upper end of the heat sink 3 and is in fluid communication with the through hole 34. The heat absorption mechanism 6 is secured onto a heat source (e.g., CPU) 7 so as to absorb heat therefrom. Next, the absorbed heat is transferred from the heat absorption mechanism 6 to the heat sink 3 for quickly dissipating. At the same time, the current of air passed through the pores 30 can carry away heat around the pores 30. In the invention, the cooler 5 can be mounted in a narrow internal space of an electronic device. In the invention, the heat absorption mechanism 6 is shaped like a disk. Also, the shape and size of the heat sink 3 should be adapted to the internal space of the electronic device. Moreover, for enabling heat absorbed by the heat absorption mechanism 6 to quickly transfer to the heat sink 3 an upright extension member 60 having a pointed end is formed on the heat absorption mechanism 6. The extension member 60 is fitted into the through hole 34. The provision of the extension member 60 can increase a contact area between the heat sink 3 and the heat absorption mechanism 6. As an end, heat absorbed by the heat absorption mechanism 6 can be quickly transferred to the heat sink 3.

Referring to FIGS. 2 and 3 specifically, there is shown another preferred embodiment according to the invention. The heat-directing member 4 is implemented as a high pressure connector which is in turn coupled to a second high pressure connector. At this time, the second high pressure connector is coupled to an air compressor. As such, high pressure low temperature current of air generated by the air compressor may pass through the heat sink 3 for more quickly cooling the heat sink 3.

While the invention has been described by means of specific embodiments, numerous modifications and variations could be made thereto by those skilled in the art without departing from the scope and spirit of the invention set forth in the claims.

What is claimed is:

1. A porous CPU cooler comprising:

a heat sink including a plurality of pores formed therein and therearound being in fluid communication with one another;

at least one heat-directing member on the heat sink;

the heat sink further comprises a through hole extended from one end to the other and the heat-directing member is mounted on the other end of the heat sink and in fluid communication with the through hole, and a heat absorption mechanism on one end of the heat sink; and wherein, during operation, a current of air is either directed into the pores of the heat sink through the heat-directing member prior to leaving the pores on the surface of the heat sink or directed into the pores of the heat sink from the surface of the heat sink prior to leaving the heat-directing member.

2. The porous CPU cooler of claim 1, wherein the heat sink further comprises a plurality of coupled heat dissipation particles mixed with the pores filled into gaps among the heat dissipation particles.

3. The porous CPU cooler of claim 2, wherein each of the heat dissipation particles is formed of copper and the heat sink is formed by means of powder metallurgy.

4. The porous CPU cooler of claim 2, wherein a ratio of volume of the heat dissipation particles and that of the pores is from about 1:0.18 to about 1:0.20.

5. The porous CPU cooler of claim 1, wherein the heat absorption mechanism comprises an extension member facing and extended into the through hole.

6. The porous CPU cooler of claim 1, wherein the heat-directing member is a high pressure connector.

* * * * *